(12) United States Patent  (10) Patent No.: US 6,650,197 B2
Sekiya  (45) Date of Patent: Nov. 18, 2003

(54) PULSEWIDTH MODULATION APPARATUS, PRINTER, AND CONTROL METHOD THEREOF

(75) Inventor: Toshiyuki Sekiya, Ibaraki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/176,175

(22) Filed: Jun. 21, 2002

(65) Prior Publication Data
US 2003/0001686 A1 Jan. 2, 2003

(30) Foreign Application Priority Data

Jun. 27, 2001 (JP) ........................................ 2001-195388

(51) Int. Cl.[7] ............................................... H03K 7/08
(52) U.S. Cl. ........................................ 332/109; 375/238
(58) Field of Search ........................... 332/109; 327/172, 327/175; 375/238

(56) References Cited

U.S. PATENT DOCUMENTS 4,897,734 A * 1/1990 Sato et al. .................. 332/109
5,504,462 A * 4/1996 Clanciosi et al. ........... 332/109

* cited by examiner

Primary Examiner—Kenneth B. Wells
(74) Attorney, Agent, or Firm—Fitzpatrick, Cella, Harper & Scinto

(57) ABSTRACT

When pulsewidth modulation is performed with a digital data pattern, appropriate pulsewidth modulation is performed in accordance with variations of a device or a driving system. In a case of inputting data where one pixel is expressed by, e.g., 4 bits (16 tones), a 32-bit pattern having twice as many number of bits as a 16-bit pattern is prepared as a pattern corresponding to input data, and stored in digital data output unit 1001. Pulsewidth addition circuit 1007 is provided for adding a fine-adjustment pulsewidth so as to achieve a target amount of light. The pulsewidth addition circuit 1007 is set so as to achieve a minimum pulsewidth that can generate a laser beam when input data is 0.

12 Claims, 14 Drawing Sheets

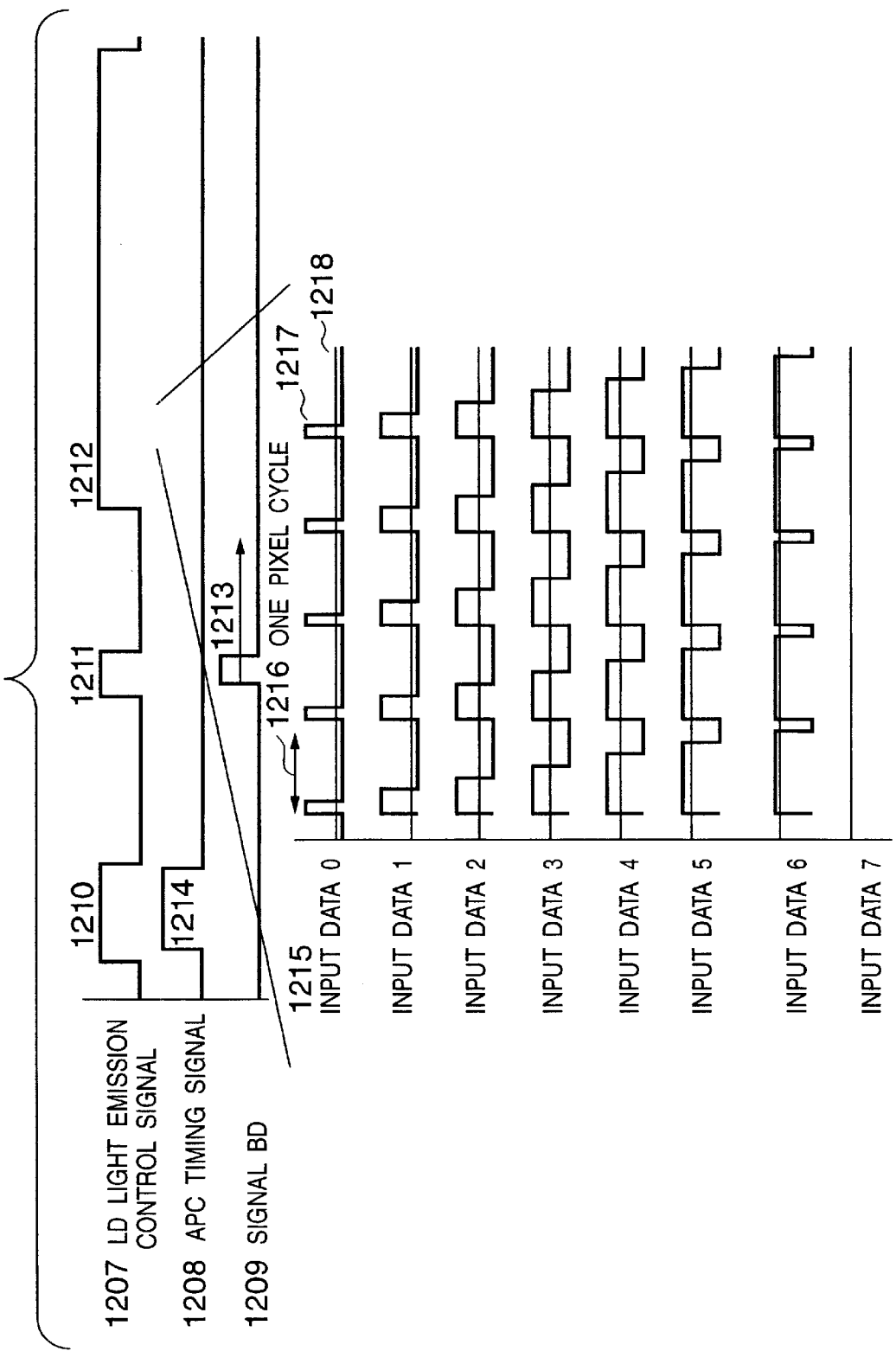

FIG. 4A

CORRECTION METHOD A

| INPUT DATA | NUMBER OF ON BITS | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|---|
| 0 | 1 | | | | | | | | | | | | | | | | | | | | | | | | | | | | | | | | |
| 1 | 3 | | | | | | | | | | | | | | | | | | | | | | | | | | | | | | | | |
| 2 | 4 | | | | | | | | | | | | | | | | | | | | | | | | | | | | | | | | |
| 3 | 6 | | | | | | | | | | | | | | | | | | | | | | | | | | | | | | | | |
| 4 | 7 | | | | | | | | | | | | | | | | | | | | | | | | | | | | | | | | |
| 5 | 9 | | | | | | | | | | | | | | | | | | | | | | | | | | | | | | | | |
| 6 | 11 | | | | | | | | | | | | | | | | | | | | | | | | | | | | | | | | |
| 7 | 12 | | | | | | | | | | | | | | | | | | | | | | | | | | | | | | | | |
| 8 | 14 | | | | | | | | | | | | | | | | | | | | | | | | | | | | | | | | |
| 9 | 15 | | | | | | | | | | | | | | | | | | | | | | | | | | | | | | | | |
| 10 | 17 | | | | | | | | | | | | | | | | | | | | | | | | | | | | | | | | |
| 11 | 18 | | | | | | | | | | | | | | | | | | | | | | | | | | | | | | | | |
| 12 | 20 | | | | | | | | | | | | | | | | | | | | | | | | | | | | | | | | |
| 13 | 21 | | | | | | | | | | | | | | | | | | | | | | | | | | | | | | | | |
| 14 | 23 | | | | | | | | | | | | | | | | | | | | | | | | | | | | | | | | |
| 15 | 28 | | | | | | | | | | | | | | | | | | | | | | | | | | | | | | | | |

FIG. 4B

CORRECTION METHOD B

| INPUT DATA | NUMBER OF ON BITS | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|---|
| 0 | 1 | | | | | | | | | | | | | | | | | | | | | | | | | | | | | | | | |
| 1 | 3 | | | | | | | | | | | | | | | | | | | | | | | | | | | | | | | | |
| 2 | 5 | | | | | | | | | | | | | | | | | | | | | | | | | | | | | | | | |
| 3 | 6 | | | | | | | | | | | | | | | | | | | | | | | | | | | | | | | | |
| 4 | 7 | | | | | | | | | | | | | | | | | | | | | | | | | | | | | | | | |
| 5 | 9 | | | | | | | | | | | | | | | | | | | | | | | | | | | | | | | | |
| 6 | 10 | | | | | | | | | | | | | | | | | | | | | | | | | | | | | | | | |
| 7 | 11 | | | | | | | | | | | | | | | | | | | | | | | | | | | | | | | | |
| 8 | 13 | | | | | | | | | | | | | | | | | | | | | | | | | | | | | | | | |
| 9 | 14 | | | | | | | | | | | | | | | | | | | | | | | | | | | | | | | | |
| 10 | 15 | | | | | | | | | | | | | | | | | | | | | | | | | | | | | | | | |
| 11 | 17 | | | | | | | | | | | | | | | | | | | | | | | | | | | | | | | | |
| 12 | 18 | | | | | | | | | | | | | | | | | | | | | | | | | | | | | | | | |
| 13 | 19 | | | | | | | | | | | | | | | | | | | | | | | | | | | | | | | | |
| 14 | 21 | | | | | | | | | | | | | | | | | | | | | | | | | | | | | | | | |
| 15 | 26 | | | | | | | | | | | | | | | | | | | | | | | | | | | | | | | | |

FIG. 7

| INPUT DATA | TARGET AMOUNT OF LIGHT | PWM WIDTH OF DEVICE A | ACTUAL AMOUNT OF LIGHT | PWM WIDTH OF DEVICE B | ACTUAL AMOUNT OF LIGHT |
|---|---|---|---|---|---|
| 0 | 30 | 1 | 30 | 1 | 30 |
| 1 | 50 | 3 | 51.71667 | 3 | 47.2 |
| 2 | 61.53846 | 4 | 59.11667 | 5 | 64.4 |
| 3 | 73.07692 | 6 | 73.91667 | 6 | 73 |
| 4 | 84.61538 | 7 | 81.31667 | 7 | 81.6 |
| 5 | 96.15385 | 9 | 96.11667 | 9 | 98.8 |
| 6 | 107.6923 | 11 | 110.9167 | 10 | 107.4 |
| 7 | 119.2308 | 12 | 118.3167 | 11 | 116 |
| 8 | 130.7692 | 14 | 133.1167 | 13 | 133.2 |
| 9 | 142.3077 | 15 | 140.5167 | 14 | 141.8 |
| 10 | 153.8462 | 17 | 155.3167 | 15 | 150.4 |
| 11 | 165.3846 | 18 | 162.7167 | 17 | 167.6 |
| 12 | 176.9231 | 20 | 177.5167 | 18 | 176.2 |
| 13 | 188.4615 | 21 | 184.9167 | 19 | 184.8 |
| 14 | 200 | 23 | 199.7167 | 21 | 202 |
| 15 | 255 | 28 | 255 | 26 | 255 |

PULSEWIDTH MODULATION APPARATUS, PRINTER, AND CONTROL METHOD THEREOF

FIELD OF THE INVENTION

The present invention relates to a pulsewidth modulation apparatus, applied to an electrophotography system utilizing exposure means, such as a laser beam or the like, an image printing apparatus using the pulsewidth modulation apparatus, and a control method thereof.

BACKGROUND OF THE INVENTION

A construction of a general laser-beam printer is shown in FIG. 11, and operation thereof is described.

A laser chip 23 comprises a laser diode and a photodiode which receives backlight of the laser diode. An LD driver 24 supplies a driving current Id for controlling emission of the laser diode. A monitor current Im, detecting the amount of light emitted from the photodiode, is inputted to the LD driver 24 to perform automatic power control (APC) of the amount of light emission of the laser diode.

A modulated laser beam generated by the laser chip 23 is polarized by a polygon mirror 18, which is fixed to a motor axle and rotated in the direction of the arrow shown in FIG. 11, and scanned on a photosensitive drum 20. An f-θ lens 19 is provided to condense the polarized modulated laser beam on the photosensitive drum 20 at a regular linear velocity. The photosensitive drum 20 and printing toner are electrostatically charged to predetermined levels in advance. Since the amount of toner attachment changes in accordance with the amount of light irradiated on the photosensitive drum 20, a halftone image can be printed. A BD mirror 21 is provided with a fixed mechanical position relation with the photosensitive drum 20. A laser beam reflected by the BD mirror 21 is inputted to a photoreceptive diode 22, and used to detect a data write starting position on the photosensitive drum 20. An output of the photoreceptive diode 22 is inputted to a horizontal synchronization signal generator 27 to generate a horizontal synchronization signal BD. The signal BD is inputted to a pixel modulator 25. The pixel modulator 25 generates a pixel clock synchronizing with the horizontal synchronization signal BD or a coefficient-fold clock of the signal BD. Based on the pixel clock, a read clock RK for reading pixel data is inputted to a pixel data generator 26. The pixel data generator 26 outputs pixel data D and a write clock WK to the pixel modulator 25. Based on the inputted pixel data, a pixel modulation signal ON, which enables modulation of a desired amount of a laser beam, is outputted to the LD driver 24.

Furthermore, the above-described construction may be provided for four photosensitive drums 1020a to 1020d as shown in FIG. 12. By providing each of the photosensitive drums with the structures for laser-scanning and developers respectively having Y, M, C and Bk toner located next to each other, it is possible to print a color image, produced by superimposing each of the color components, on a sheet of print paper 1028.

In order to express density of a print image (in a case of a color image, density of each color component), the amount of light corresponding to the density of an image to be printed is irradiated as described above.

In general, a pulsewidth modulation (PWM) system is known as effective means to control the amount of light irradiation. FIG. 13 shows an example of a construction which realizes a PWM system.

In FIG. 13, reference numeral 1 denotes a digital data output unit which converts printing data (multivalued image data) from an external device, such as a computer or the like, to a multivalued data string for each scanning line. Reference numeral 2 denotes a lookup table which inputs the multivalued data outputted from the digital data output unit 1, executes table conversion corresponding to predetermined function processing, and outputs multivalued data. Reference numeral 3 denotes a D/A converter which inputs the multivalued data from the lookup table 2, and outputs a corresponding analog voltage signal.

Reference numeral 5 denotes a horizontal synchronization signal generator based on the signal BD mentioned above; 6, a reference frequency generator; 7, a timing signal generator which generates a timing signal for each component of the apparatus; and 8, a triangular wave generator which generates an analog triangular wave in accordance with the timing signal (clock signal) supplied by the timing signal generator 7.

Reference numeral 4 denotes a comparator which compares the analog signal based on image data (output signal of the D/A converter 3) with the triangular wave outputted by the triangular wave generator 7, and outputs the comparison result as a logical high/low pulse signal. Accordingly, the comparator 4 outputs a signal having a pulsewidth corresponding to a pixel value. Reference numeral 8 denotes a raster scanning print engine, having a construction for driving a laser device in accordance with a pulsewidth of a pulsewidth modulation signal as described above with reference to FIG. 11. Therefore, in one pixel cycle, light emission time of a laser beam is determined based on a pixel value. In this manner, the amount of light emission can be controlled.

The above-described construction realizes an image modulator, in which inputted multivalued image data is subjected to γ conversion with an appropriate function and subjected to pulsewidth modulation with a weight corresponding to the result of the γ conversion.

Note as the aforementioned comparator, although an analog comparator is employed, by employing a digital comparator and generating a digital triangular wave, a digital pulsewidth modulator which directly compares the γ-converted multivalued image data with the digital triangular wave can be constructed. In the case of employing such digital system, characteristic variations due to a temperature drift and variations of components, which are problematic in the analog method, can generally be made small.

However, in the case of employing the above-described digital pulsewidth modulator which adopts a triangular wave comparison method, there are disadvantages, such as a necessity of a fairly high-speed counter and a high-speed comparator, as well as an enlarged size of the circuit.

In view of this, recently proposed is an image modulator in which an output pattern of a pixel is expressed in advance by a string of binary data representing light emission/non light emission, plural types of the output patterns are set in advance in a digital circuit for the number corresponding to values of inputted image tones, then upon inputting multivalued image data, the output pattern is selected and read out, and the read binary data strings are serially outputted.

For instance, assuming a case of inputting 4-bit input data (16 tones), 16 bits are prepared as pattern data. For input data "3", a pattern having "1" for the first three bits and "0" for the subsequent thirteen bits is stored. When this data (value 3) is inputted, 1110000000000000B (B indicates binary data) is sequentially outputted, thereby generating a signal having a corresponding pulsewidth.

However, the above technique has the following problems.

Because the number of bits in a light emission pattern is only $2^n$ (or $(2^n)-1$) while the number of bits of input data is n, the light emission pattern is determined practically on a one-to-one basis with the inputted image data. Therefore, it is impossible to correct variations in input-output functions, due to the output driving pattern corresponding to each input data and unevenness in electric and optical characteristics of a laser driver and laser device that follow the output driving pattern.

In a case where a block in which the output light emission pattern is set is fixedly constructed with logical hardware, because the light emission pattern is determined on a one-to-one basis with inputted image data, it is impossible to correct variations in input-output functions, due to the output driving pattern corresponding to each input data and unevenness in electric and optical characteristics of a laser driver and laser device that follow the output driving pattern.

If the aforementioned variations are individually measured in advance in a stage of apparatus assembling adjustment and stored in ROM constituting the block where the output light emission pattern is set, the variations of initial characteristics can be corrected individually. However, variations caused by environmental changes or variations generated over time cannot be corrected. In a case of adopting a RAM system, values are initialized from the system side when starting up the apparatus. However, since this is only to rewrite set data held by the system, the problem is not solved.

SUMMARY OF THE INVENTION

The present invention has been proposed in view of the conventional problems, and has as its object to provide a pulsewidth modulation apparatus, which enables appropriate pulsewidth modulation in accordance with variations of a device or a driving system in a case where pulsewidth modulation is performed with digital data patterns, and to provide a printer utilizing the pulsewidth modulation apparatus, and a control method thereof.

In order to solve the above problems, the pulsewidth modulation apparatus according to the present invention has, for instance, the following configuration. More specifically, a pulsewidth modulation apparatus for inputting multivalued pixel data expressed in a plurality of bits, generating a signal having a pulsewidth corresponding to a value of the multivalued pixel data, and outputting the generated signal to a predetermined print engine, comprises storage means arranged to store a digital pattern in an address position corresponding to the value of each multivalued pixel data in order to generate a binary-valued pattern corresponding to the value of the multivalued pixel data; and output means arranged to access the storage means by using inputted multivalued pixel data as an address to read a corresponding binary-valued pattern, and output a pulsewidth signal corresponding to a state of bits of the pattern, wherein the pattern stored in the storage means has a number of bits larger than a number that can be expressed by a number of bits of the inputted multivalued pixel data, and the pattern is rewritable.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

FIG. 3 is a timing chart employed in the construction shown in FIG. 2;

FIGS. 4A and 4B are views showing a relation between a digital pulsewidth and an additional pulsewidth of laser driving devices A and B;

FIG. 7 is a table showing a relation between the target amount of light for each input data and a PWM width of each device according to the embodiment;

DETAILED DESCRIPTION OF THE PREFERRED EMBODIMENTS

Preferred embodiments of the present invention will now be described in detail in accordance with the accompanying drawings. Note in this embodiment, a laser beam printer is described.

A laser beam printer adopts a pulsewidth modulation (PWM) system for printing tones of an image. Known means to realize PWM is to convert a multivalued image signal to an analog signal, compare the analog signal with a triangular wave to generate a pulsewidth signal corresponding to a value of a pixel, and use the generated signal to drive a laser device. In this embodiment, PWM is realized by employing digital control instead of the analog control.

Figure 1:
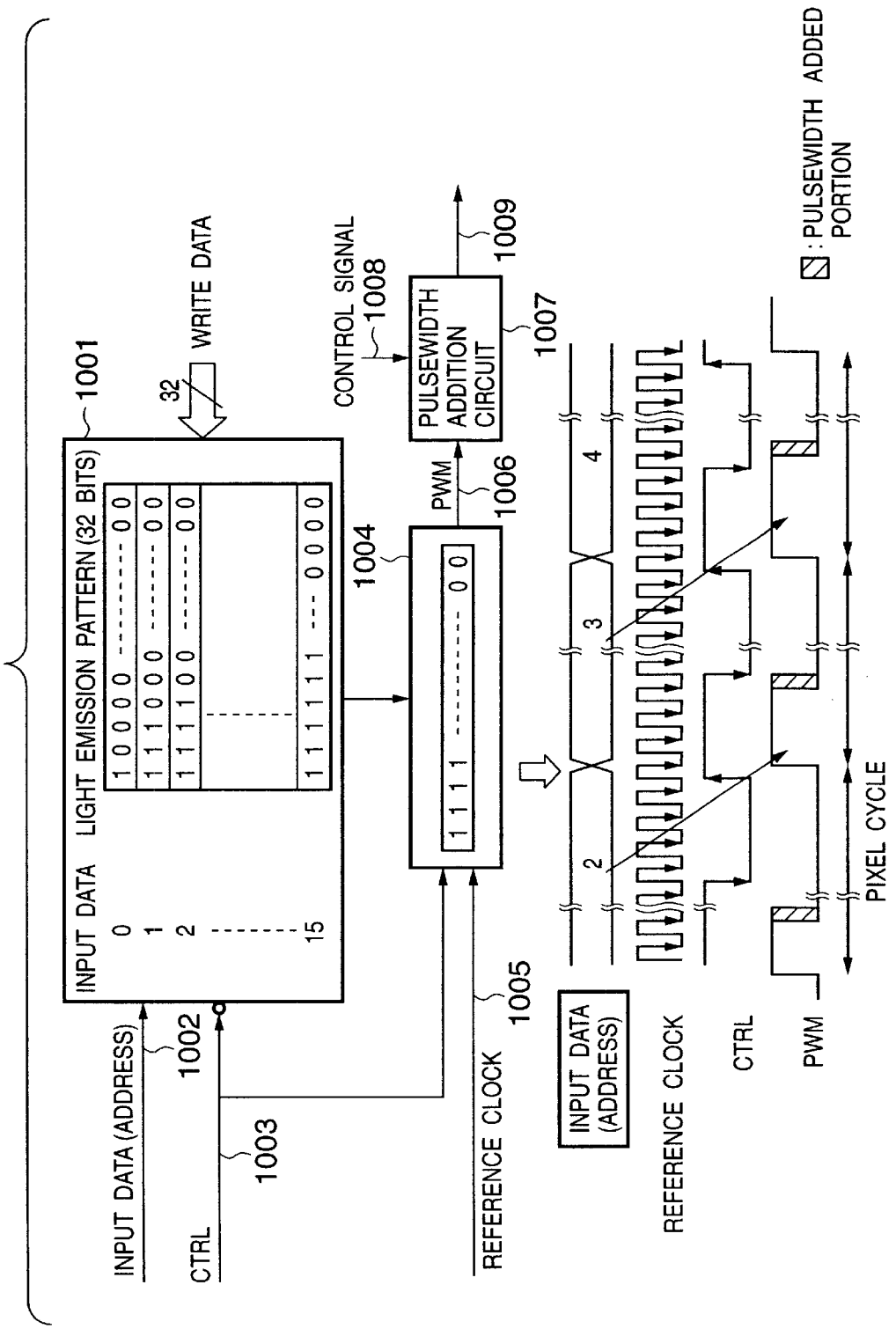
FIG. 1 is a block diagram showing a main unit of a printer according to an embodiment of the present invention.

FIG. 1 is a block diagram of a main unit realizing PWM according to this embodiment and a timing chart thereof. Note that the embodiment describes an example in which an input pixel value has 4 bits, i.e., an image can be reproduced in 0 to 15 tones (16 tones). However, the number of bits of an input pixel is not limited to this example.

Referring to FIG. 1, reference numeral 1001 denotes a digital data output unit storing 32-bit light emission patterns for addresses 0 to 15. The digital data output unit is configured with a non-volatile memory (e.g., EEPROM, flash memory or the like) to enable rewriting contents thereof and maintaining the data when the power is turned off. Reference numeral 1002 denotes input data (4-bit pixel data), which is supplied to the digital data output unit 1001 as an address. Reference numeral 1003 denotes a control signal. Normally, a read signal is inputted to the digital data output unit 1001 in synchronization with pixel data. Note in a case of rewriting data in the digital data output unit 1001, the control signal is changed to a rewrite signal, a pixel value is supplied as an address, and 32-bit data is supplied through a data bus shown in the drawing, thereby rewriting the data stored in the digital data output unit 1001. Reference numeral 1004 denotes a shift register, which loads 32 bits of data in the position designated by the input data, and outputs a logical high signal for one clock cycle to the bits having "1", while shifting the data in units of 1 bit in synchronization with a reference clock 1005 (a 32-fold frequency of the clock of the input data). In other words, for a pattern serially having "1", a PWM signal 1006 having a width corresponding to the number of 1 is outputted. Reference numeral 1007 denotes a pulsewidth addition circuit which adds a pulsewidth signal for fine adjustment to the end of the PWM signal 1006 (details will be described later in the description of pulsewidth addition amount setting processing). The additional pulsewidth signal can be changed by the control signal 1008 (in the timing chart shown in the lower portion of FIG. 1, the pulsewidth is increased by the hatched portion).

Figure 2:
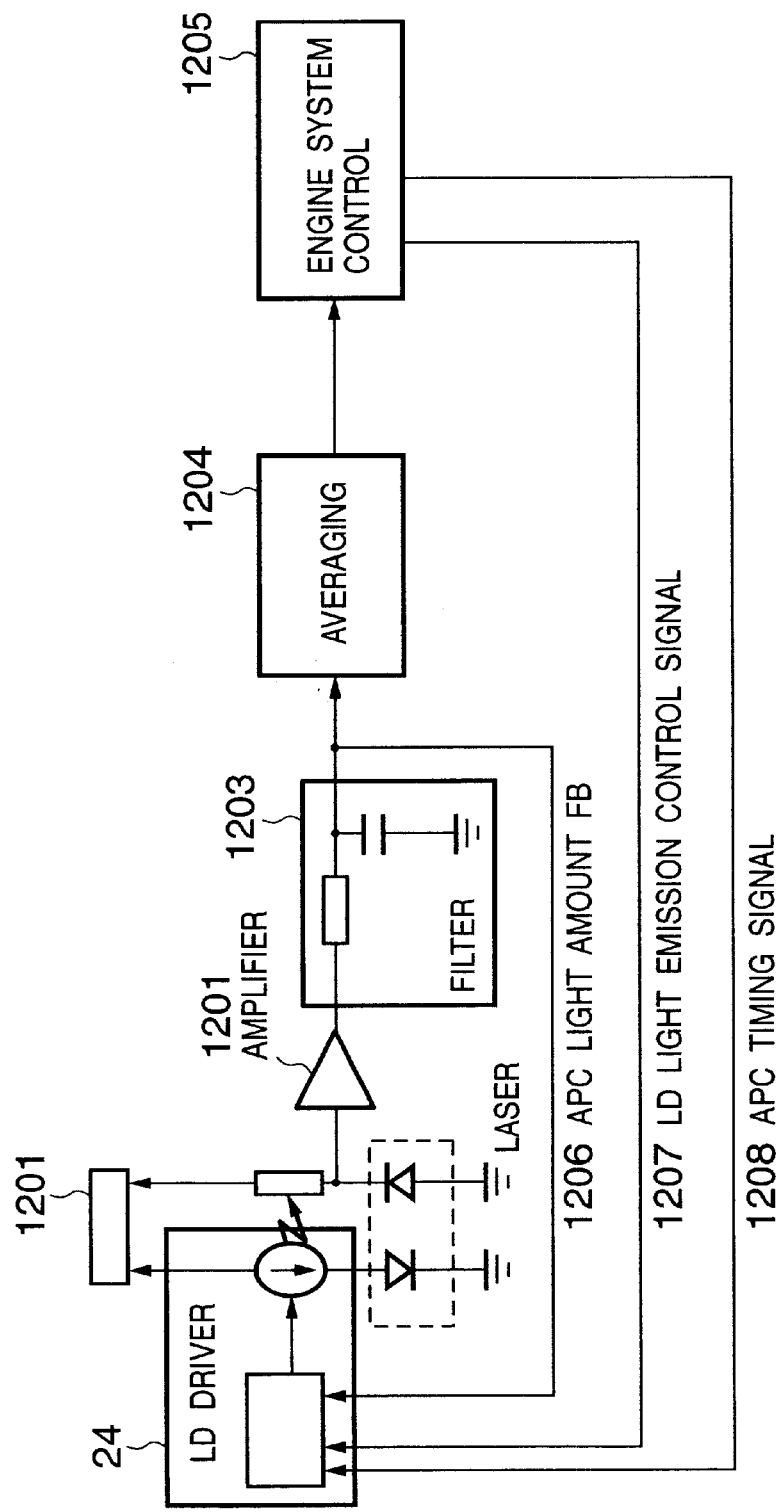
FIG. 2 is a block diagram of a light amount detector according to the embodiment of the present invention.

Described next is FIG. 2, showing a block diagram (light amount detector) of a driving unit of the laser device and its surroundings.

Referring to FIG. 2, reference numeral 1201 denotes a power supply for biasing a laser device and a photo-detector (PD). Reference numeral 1202 denotes an amplifier which amplifies the amount of laser beam detected by the PD, located inside the laser device. Reference numeral 1203 denotes a filter for damping high-frequency ripples or noise components of an output of the amplifier. Reference numeral 1204 denotes an averaging processor for obtaining an average value of the filter's outputs. Reference numeral 1205 denotes an engine of an image forming apparatus. Reference numeral 1206 denotes an APC light amount FB (feedback) that is a feedback signal for feedback-controlling the amount of laser beam to a predetermined value. Reference numeral 1207 denotes an LD light emission control signal for controlling emission/non emission of the laser device. Reference numeral 1208 denotes an APC timing signal for designating opening or closing a control loop of the feedback control of the amount of laser beam. Each of these control signals is supplied to the LD driver 24.

FIG. 3 is an operation timing chart in a test mode. In FIG. 3, reference numeral 1210 denotes an APC timing; 1211, a beam detect timing; and 1212, an image zone timing. In this embodiment, assume that a laser beam is emitted when a logical signal is High (hereinafter referred to as H), and turned off when a logical signal is Low (hereinafter referred to as L). In normal printing processing, a signal corresponding to each pixel data is outputted in the image zone timing 1212. When a test mode is designated from an operation panel (not shown), signals indicative of input data 0 to 15 (although the drawing shows skipped values, in reality, data for 0, 1, 2, . . . , and 15) are serially outputted (for instance, one scan line). Since the test mode is intended to perform detection and correction of the amount of light, conveyance of printing paper or generation of a toner image by a developer is not performed.

Reference numeral 1214 denotes an APC timing where the feedback loop is closed at H (feedback control is performed) and opened at L.

Reference numeral 1215 denotes input data; 1216, one pixel cycle in the image writing zone; 1217, a light amount detection value indicative of an output of the filter; and 1218, an average amount of light value indicative of the average output value.

Reference numeral 1209 denotes a signal BD, representing detection of a laser beam passing detected by a sensor, which is located outside the image writing area by a predetermined width. Reference numeral 1213 denotes a beam-detected timing.

Hereinafter, the sequence of the test mode is described with reference to FIG. 3. First, the LD light emission control signal is made H to emit a laser beam (timing 1210). Then, the APC timing signal is made H to close the laser light amount feedback loop, thereby generating a controllable state (timing 1214). In this stage, the APC light amount FB signal corresponding to the filter output is sampled by the LD driver 24, and the amount of laser beam is recognized. The amount of sampled laser beam is compared with a predetermined target value (not shown). If the amount is lower than the target value, the laser driving current is increased, whereas if the amount is higher than the target value, the laser driving current is decreased. In this manner, the amount of laser beam is controlled to match the target value after a predetermined damping time.

After a predetermined damping time, the APC timing signal is returned to L. When the LD driver 24 recognizes this state, it opens (cut off) the feedback loop. At the same time, the control state is maintained as it is, and the value in this state is fixed for laser driving.

Next, normal beam detect operation (treated as horizontal synchronization signal) is described. Upon adjusting the amount of light beam to a predetermined level in the above-described APC operation, the LD light emission control signal is again made H (timing 1211) to turn on the laser at the timing which is appropriately prior to the timing the laser beam passes the beam detect sensor. When the laser beam passes the beam detect sensor, the beam detect signal is inverted, confirming beam detection that notifies passing of the laser beam (timing 1213). Then, the LD light emission control signal is returned to L to turn off the laser.

Next, a pulsewidth addition function (determining processing of the signal 1008 supplied to the pulsewidth addition circuit 1007 in FIG. 1) is described.

Due to a light emission rising characteristic of a laser device and a current rising characteristic of a laser driver provided before the laser device, a laser beam is not generally emitted by a pulse signal having a smaller pulsewidth than a predetermined pulsewidth. For this reason, for an input data value corresponding to the lowest light emission (normally 0), a pulse adding up the delay time (the smallest pulsewidth that can emit laser beam) is added to a PWM output from the shift register. Although this pulsewidth addition depends upon the construction of the apparatus, in this embodiment, assume that the pulse is added uniformly to each final edge of the pulse 1006 (FIG. 1) regardless of input data as mentioned above (this will be described later with reference to FIG. 6).

Next, a description is provided on the characteristic point of the present embodiment, in which the number of binary-valued dots of a light emission pattern for one pixel is made larger (to be more specific, the twice as many number or more is preferable) than the number of types of multivalued input pixel data (4 bits=$2^4$=16 types).

FIGS. 4A and 4B are tables where output driving patterns are set for each input data. Two tables are provided for appropriately correcting unevenness of laser beam emission devices A and B.

Since it is assumed in this embodiment that input data for one pixel is 4 bits, there are input data values 0 to 15, and an output pattern has 32 bits. In FIGS. 4A and 4B, "the number of ON bits" indicates the number of dots (left-aligned) stored in the digital data output unit 1001 in FIG. 1. The hatched portions indicate portions added by the pulsewidth addition circuit 1007.

Hereinafter, the process of generating the correction data is described.

Figure 5:
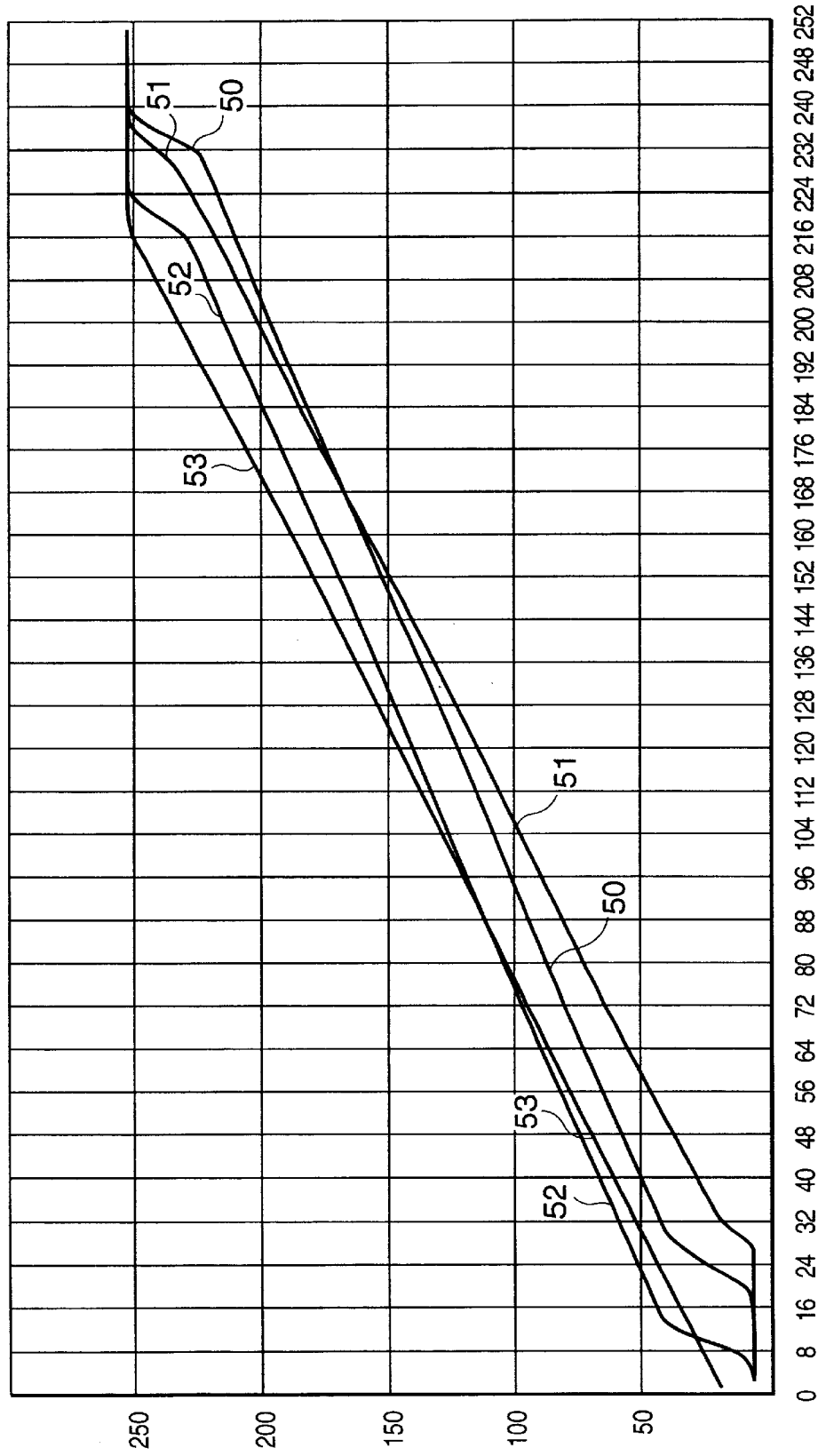
FIG. 5 is a graph showing a bare characteristic of a relation between the pulsewidth and amount of light of the laser driving devices A and B, and a characteristic upon correction performed for the amount of light 0.

FIG. 5 is a graph showing an average amount of laser beam for a duty of a pulse signal inputted to laser driving devices A and B. In the horizontal axis, 0 indicates the minimum value 0%, and 255 indicates the maximum value 100%. In the vertical axis, 0 indicates the minimum value and 255 indicates the APC light amount. The lines 50 and 51 in FIG. 5 show bare characteristics of the devices A and B before the aforementioned pulsewidth addition is performed.

Generally it is assumed that a driving system supplies a predetermined bias current to a laser device even when a minimum-level pulsewidth for obtaining a laser beam is inputted. Therefore, a predetermined offset LED emission component exists. On the contrary, the average amount of light becomes equal to the APC light amount when the pulsewidth is in the maximum level, because of a delay characteristic caused when the laser device and laser driver are turned off, contrary to the minimum-level pulsewidth. In this embodiment, a description is provided assuming that the minimum amount of light is 30.

When input data is 0, in order to perform pulsewidth addition to achieve the amount of light 30 in the devices A and B, it is necessary to enlarge PWM for input data 0. In this embodiment, a pulsewidth is added so that the device A (having the bare characteristic 50) achieves the characteristic 52 and the device B (having the bare characteristic 51) achieves the characteristic 53 for input data 0 as shown in FIG. 5 (the graph lines practically shift in parallel).

Figure 6:
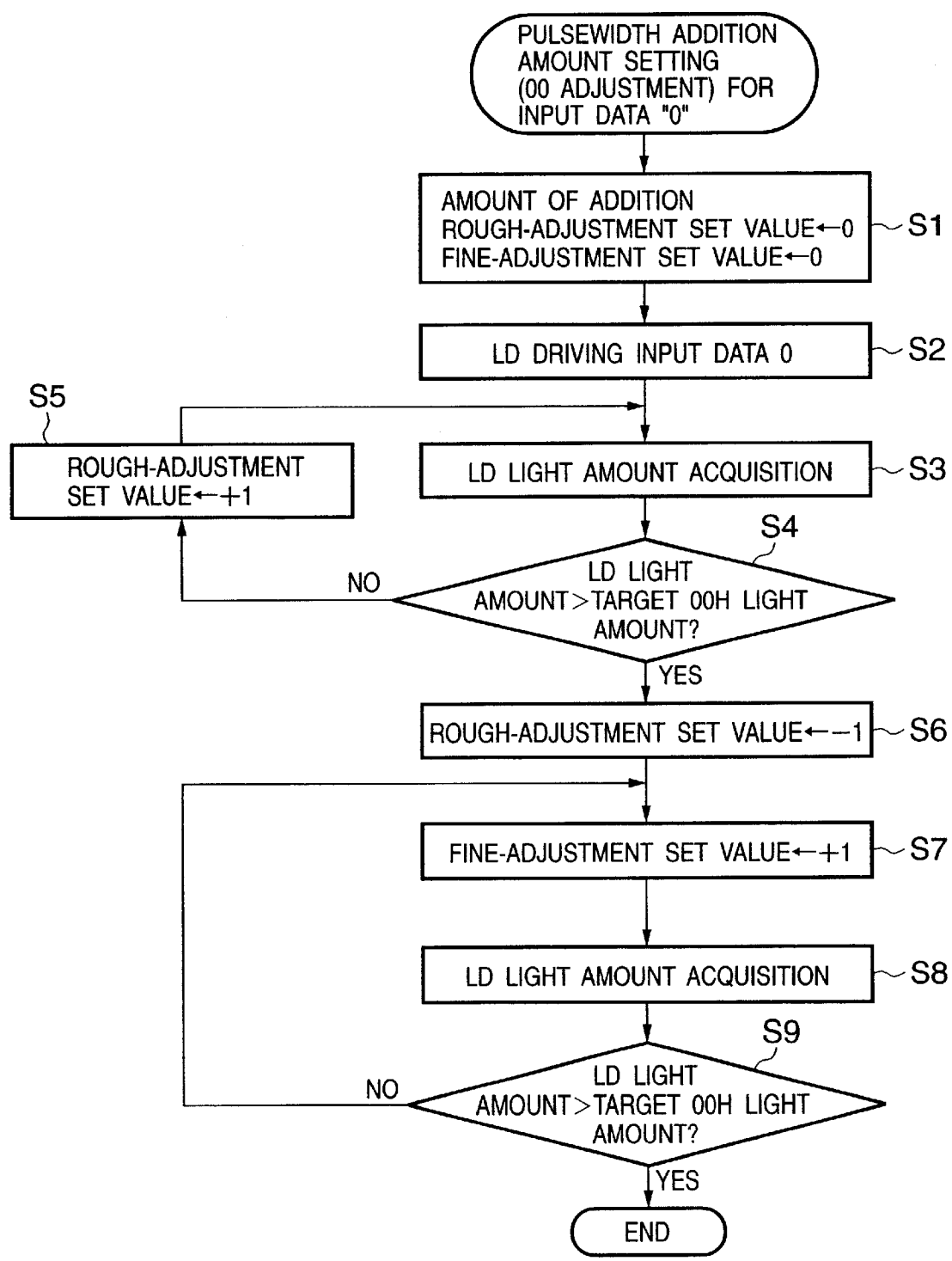
FIG. 6 is a flowchart showing determination processing steps of a pulsewidth addition amount for the amount of light 0 in FIG. 5.

A method of pulsewidth addition amount setting (the amount of shifting) is described with reference to the flowchart shown in FIG. 6.

Note although this processing is performed in an adjusting step of apparatus assembling, it may be regularly performed by a user.

In step S1, the number of dots of the light emission pattern for data input 0 is set to 1 dot (a pattern having "1" followed by thirty-one "0"), thereby setting the pulsewidth addition to 0. In this example, the pulsewidth addition value includes a rough-adjustment set value and a fine-adjustment set value. Both values are set in 0. In this state, input data 0 is serially inputted (step S2). The light amount detector (1204 in FIG. 2) measures an average value of the amount of laser beam emission in this stage.

In steps S3 to S5, the rough-adjustment set value (value set in the pulsewidth addition circuit 1007 in FIG. 1) is incremented by one step, and each time the value is incremented, it is determined whether or not the amount of laser beam exceeds the target value. In this example, the target value is 30. When the amount of laser beam exceeds 30, the repeated routine ends. When it is determined that the amount of laser beam exceeds 30, the rough-adjustment set value is returned to the value of the previous step in step S6.

In steps S7 to S9, the fine-adjustment set value is incremented by one step, and each time the value is incremented, it is determined whether or not the amount of laser beam exceeds the target value 30. When the amount of laser beam exceeds 30, the adjustment routine ends. Although it is possible to perform a fine-adjustment setting step that more closely achieves the target value by using the value obtained when the amount of laser beam exceeds the target value and the value of the previous step, this example omits such process.

In the foregoing manner, a pulsewidth that can most closely achieve the amount of light beam 30 for input data 0 is determined.

Since the pulsewidth addition is uniformly performed on each light emission pattern of all the input data, the relation between the amount of light beam emission and the duty of a pulse signal prior to pulsewidth addition is shifted in parallel, as represented by the lines 52 and 53 in FIG. 5.

In this embodiment, since one output pattern is formed with 32 dots, pulsewidth adjustment is performed so that the amount of light beam 30 is achieved at a position of X coordinate 8 (=256/32) which corresponds to 1 dot. Although there may be an adjustment remainder depending on a resolution of the adjustment steps, the drawing shows the state of perfect adjustment for the purpose of simplicity.

Next, a relation between input data and the amount of output light is described.

Conventionally, since the number of dots of the pattern is $2^n$ while the number of bits of input data is n, the amount of output light is determined on a one-to-one basis with the input data. For instance, in a case where 16 types of 4-bit data are inputted, the number of dots in a pattern is 16. Therefore, the dot numbers 1 to 16 or 0 to 15 are practically allocated to the 16 types of input data. On the contrary, according to the present embodiment, it is possible to set the number of dots twice as many (or more) as the number of types of input data as shown in FIG. 1. Therefore, finer setting is possible. More specifically, since 32 dots can be allocated to 16 types of input data, it is possible to make adjustment so that a predetermined relation between the input data and the amount of light is achieved.

For instance, assume that it is to achieve the amount of light 50 when input data is 1, achieve the amount of light 200 when input data is 14, and achieve the amount of light 255 when input data is 15.

In FIG. 5, on the point of the step of horizontal axis 8 (=256/32), a point that can most closely achieve each target amount of light is determined. There are cases that plural steps achieving the amount of light 255 exist. In this case, for instance, a rule adopting the smallest step is employed. Furthermore, the amount of light 50 to 200 are uniformly divided by 13, and the point that most closely achieves each of the 12 values of the amount of light on the point of the step of horizontal axis 8 is allocated to each of the input data 2 to 13. Each step determined in the foregoing manner is allocated to the light emission pattern table as the number of dots in units of 8 steps.

The obtained number of dots is left aligned and set in the light emission pattern table as shown in FIGS. 4A and 4B. "The number of ON bits" in the drawing indicates the number of bits of "1" in the data stored in the digital data output unit 1001 in FIG. 1. The hatched portions correspond to the set contents of the pulsewidth addition circuit 1007.

As described above, by virtue of having the number of binary-valued dots of a light emission pattern for one pixel twice as many as the number of types of multivalued input image data, in the light emission modulation means having in storage means a plurality of types of a light emission pattern for one pixel, expressed in an emission/non emission binary-valued dot string, for each multivalued input image data, which reads out the light emission pattern from the storage means in accordance with multivalued input image data inputted in time series and outputs a light emission driving signal to a light emission device, uneven transmission characteristics of a laser driving device or laser are absorbed, and the relation between the input data and the amount of output light can individually be adjusted to a predetermined characteristic.

Hereinafter, a description is provided on setting processing of the number of dots for input data 0 to 15 (to be more specific, input data 1 to 15 excluding 0, since the number of dots for input data 0 has been determined in the pulsewidth addition processing).

To simplify the description, the target amount of light (average) for each input data is set as that shown in FIG. 7, reflecting the above description. In FIG. 7, values of the target amount of light for input data 0 to 15 are the final target values.

In this embodiment, data 0 is serially outputted in the test mode at timing 1212 in FIG. 3 to determine a pulsewidth to be added for achieving the amount of light 30. As a result, a parameter to be set in the pulsewidth addition circuit 1007 is determined. Thereafter, processing for determining a 32-bit pattern for each of the data 1, 2, . . . , and 15 is performed.

Herein, an initial number of dots for data 1 is determined (determined similarly for data 2 to 15), and a pattern that most closely achieves the target amount of light is decided as a dot pattern for data 1, and the pattern is stored in the digital data output unit 1001. Hereinafter, details are described.

Figure 8:
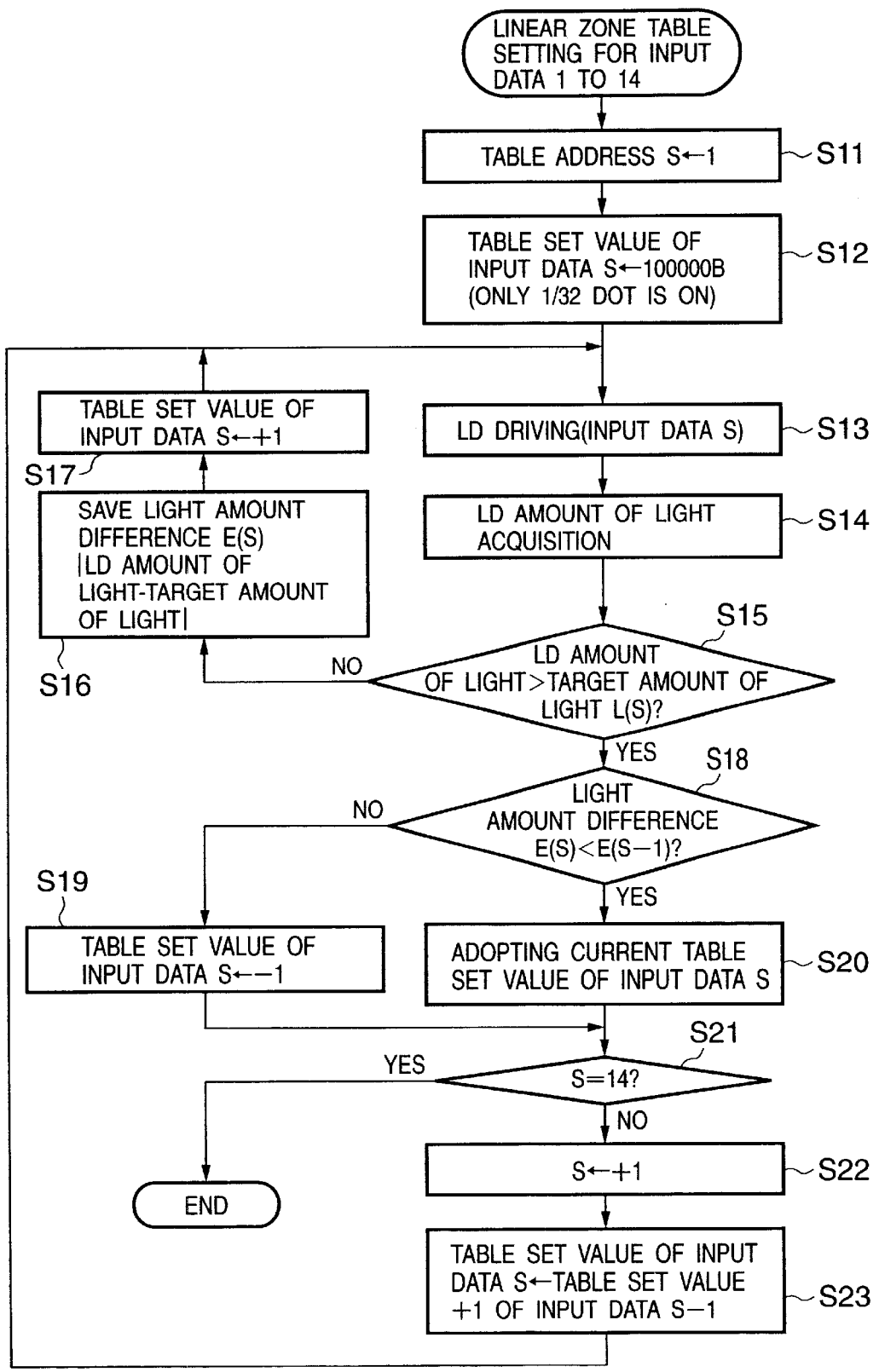
FIG. 8 is a flowchart showing steps of PWM determination processing.

FIG. 8 shows processing contents for the input data 1 to 14.

In step S11, 1 is set in the data address S. This is equivalent to setting input data 1 as an address of the digital data output unit 1001 in FIG. 1.

Next, data having 1 for the first one bit and 0 for the remaining thirty-one bits (if the data is expressed in a hexadecimal numeral (H) with the first bit being a MSB, 80000000H) is set in the address S.

In step S13, LD driving is performed by serially supplying data 1. The driving result corresponds to the result of pulsewidth addition set prior to this processing. Next, in step S14, the average amount of light is acquired.

In step S15, it is determined whether or not the amount of light is larger than the target amount of light. If the amount of light has not reached the target amount of light, a difference (absolute value) between the acquired amount of light and the target amount of light is calculated in step S16. In step S17, the number of bits of "1" of the pattern stored in the digital data output unit 1001 is increased by 1 (increased so that bit 1 is successive), and the control returns to step S13.

When it is determined that the acquired amount of light exceeds the target amount of light, a difference (absolute value) between the acquired amount of light and the target amount of light is calculated in step S18, and the difference is compared with an immediately preceding difference (the timing at which the maximum amount of light that does not achieve the target amount of light is detected). The value having a smaller difference between the acquired amount of light and the target amount of light is selected and stored in the digital data output unit 1001 (steps S19 and S20).

In step S21, it is determined whether or not the value of the data of interest is 14. If NO, the control proceeds to step S23. The next address position is set in the address S, and a previously determined pattern is set as an initial pattern, in preparation for the pattern determination processing of the next data. Thereafter, the above-described processing is repeated.

Figure 9:
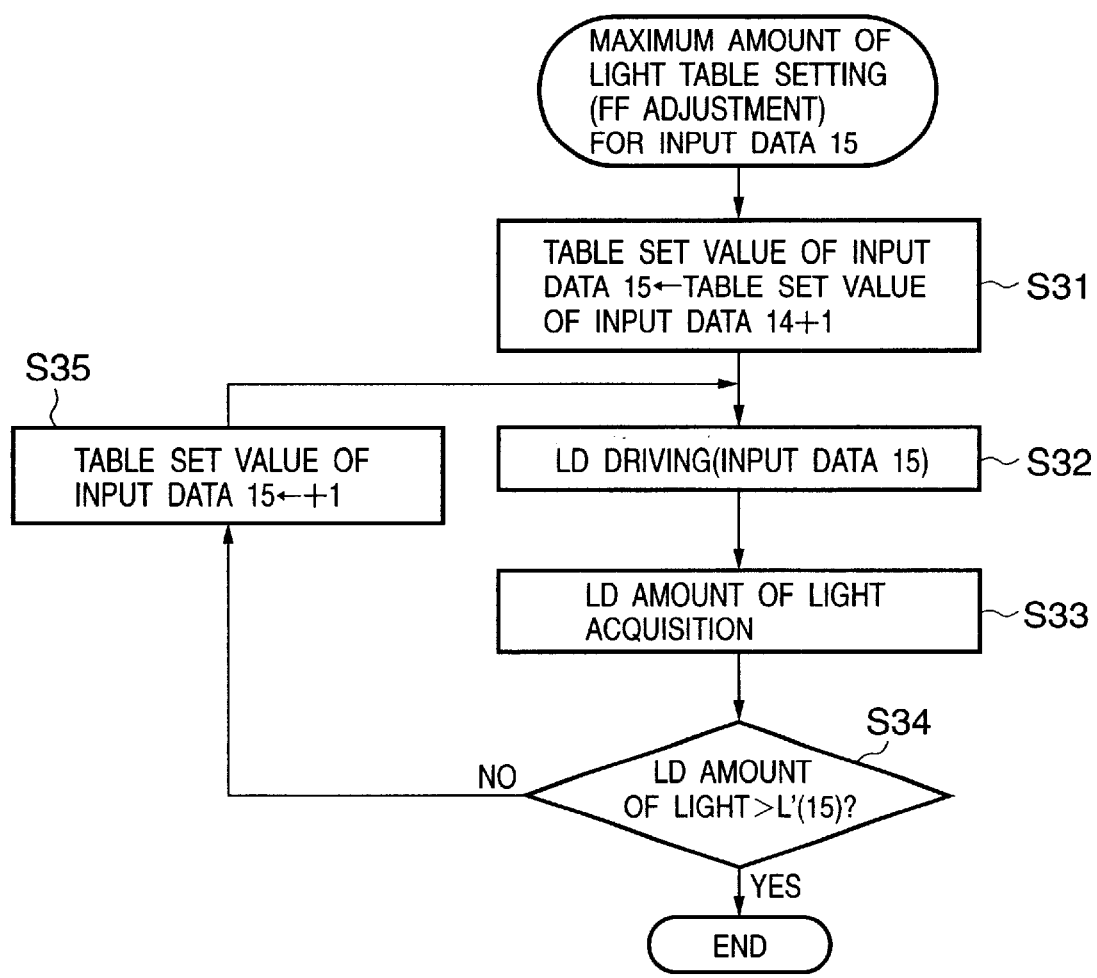
FIG. 9 is a flowchart showing steps of PWM determination processing.

Next, setting processing of table address S=15 is described with reference to FIG. 9.

In step S31, the table address S is set in 15 that is the last data. One dot is added to the pattern determined for data 14, and this pattern is set as the initial data of this table address.

In step S32, the laser is driven with the set pattern, and the amount of light is acquired in step S33. If it is determined in step S34 that the acquired amount of light does not exceed the target amount of light (L'(15)), the number of bits of "1" in the pattern is increased and the processing is repeated from step S32. When it is determined that the acquired amount of light achieves the target amount of light, this processing ends and the pattern data is adopted.

As a result of the foregoing processing, the number of ON bits for each input data, which is appropriate for each of the devices A and B, is determined as shown in FIG. 7.

Figure 10:
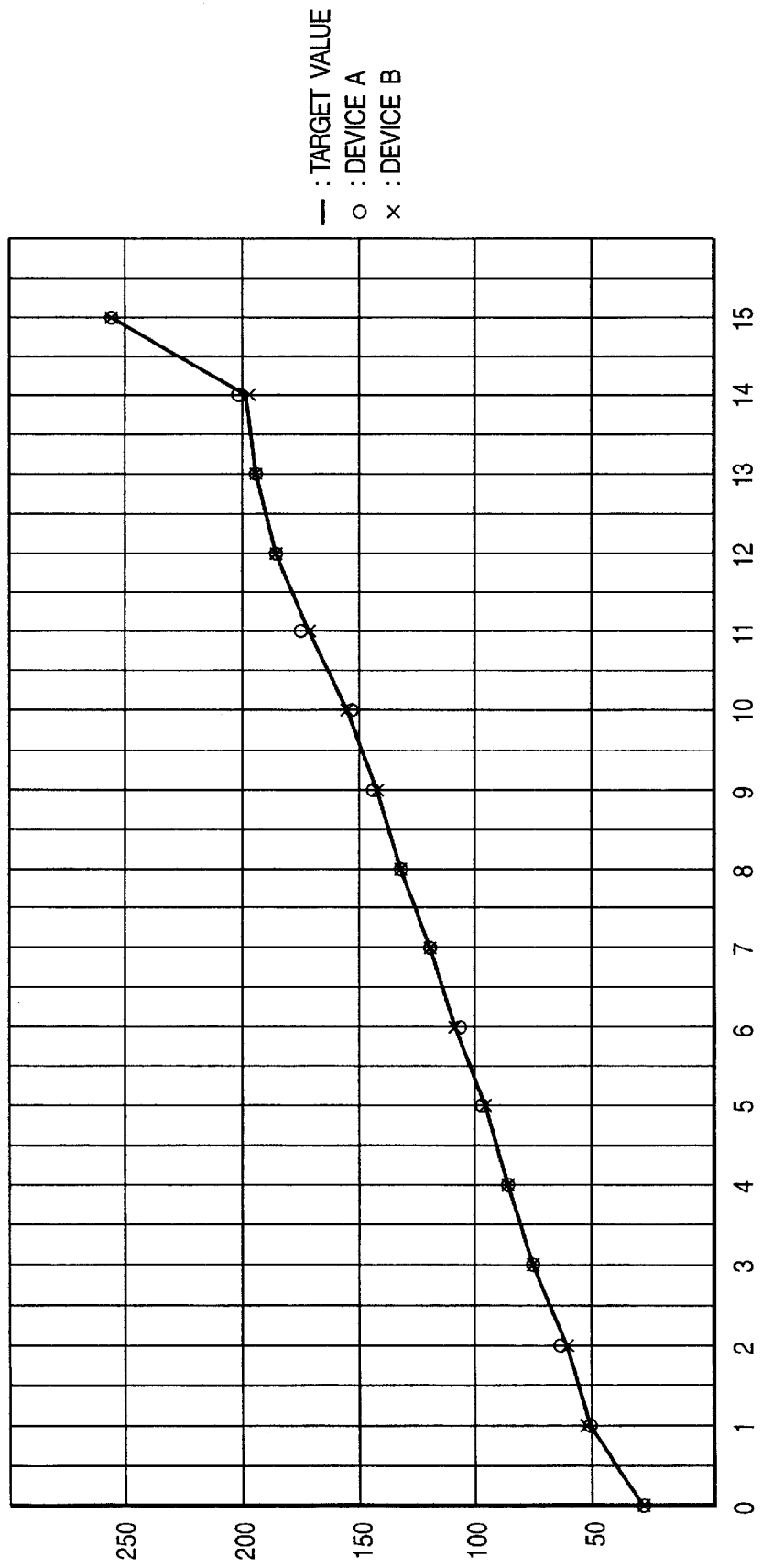
FIG. 10 is a graph in which input data according to the present embodiment and the amount of light obtained as a result of corrected PWM are plotted.

FIG. 10 is a graph in which the amounts of light achieved by the 32-bit patterns for the devices A and B and the added pulsewidth are plotted on the target-value line. By virtue of the above-described processing, the amounts of light emitted by the devices having different characteristics are about the same as the target value as shown in FIG. 10.

As has been described above, according to the present embodiment, it is possible to correct unevenness and variations of the relation between input data and the amount of output light, due to a disturbance including not only the variations in initial characteristics of the light emission device and light emission driving device but also variations caused by environmental changes or variations generated over time. Thus, it is possible to maintain high quality in formed images.

Note although the above embodiment has described processing performed in factories, this processing may be executed when a predetermined operation is performed on an operation panel which is normally included in a printer.

Furthermore, although the above embodiment has described that input multivalued pixel data has 4 bits, the present invention is not limited to this number of bits.

Figure 14:
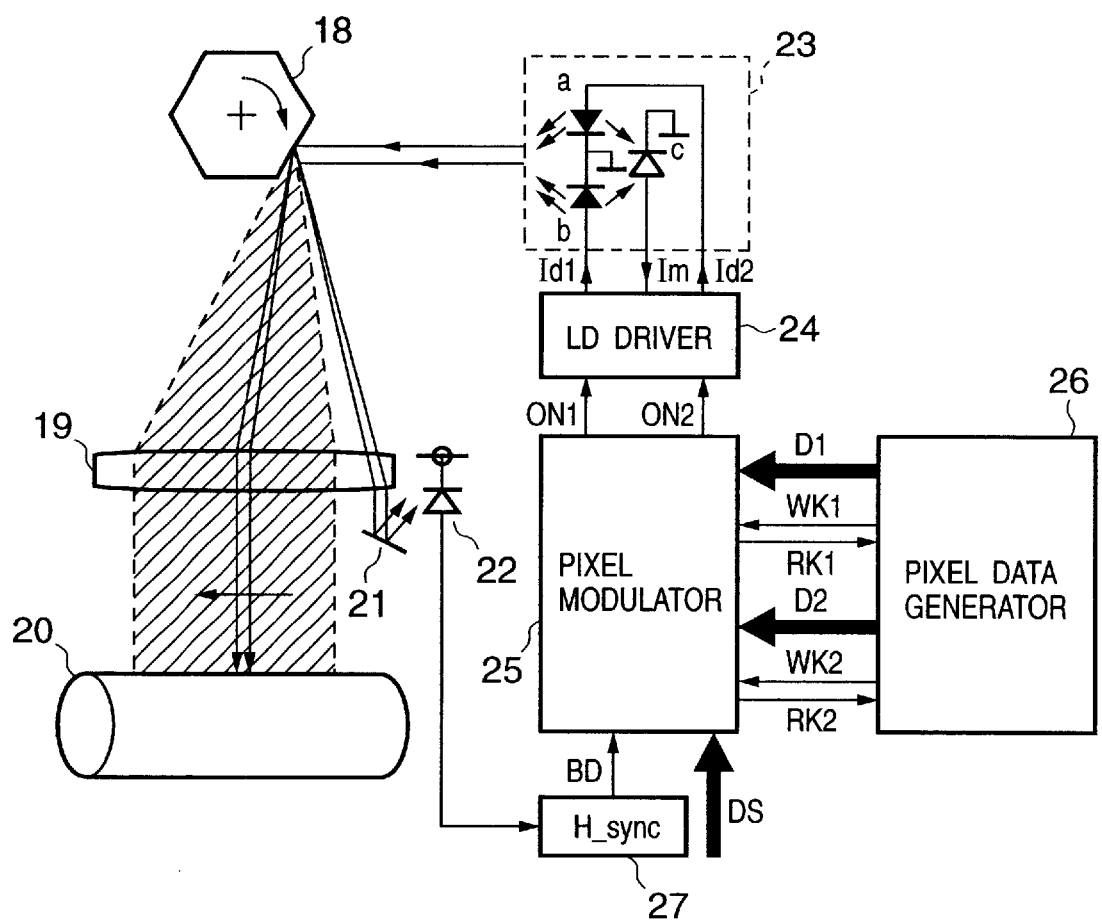
FIG. 14 is a block diagram showing a construction of a two-beam system printer engine unit adopted by the present embodiment.

Moreover, although the above embodiment has shown an example of scanning the drum with one laser beam, two laser beams may be generated as shown in FIG. 14, and the construction according to the above embodiment may be provided for each laser beam. In this case, it should be easy to understand if assumed that the two devices a and b in FIG. 14 correspond to the aforementioned devices A and B.

Figure 11:
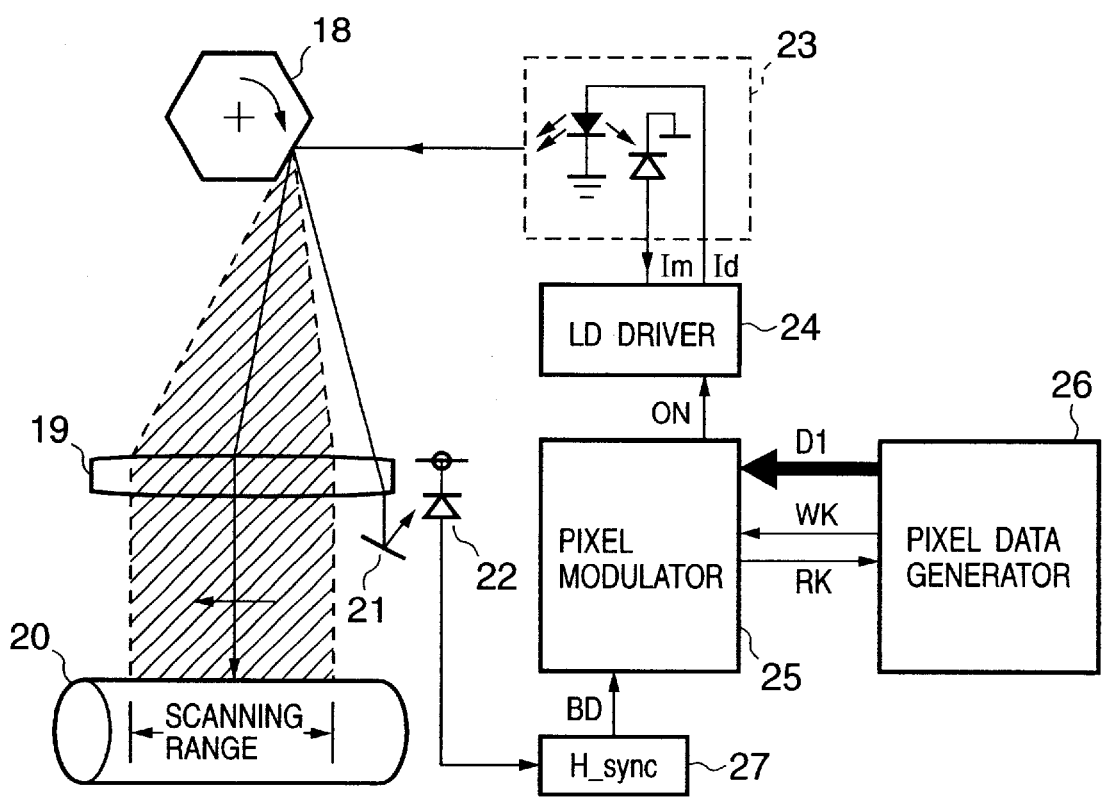
FIG. 11 is a block diagram showing a construction of an engine unit of a laser beam printer.
Figure 12:
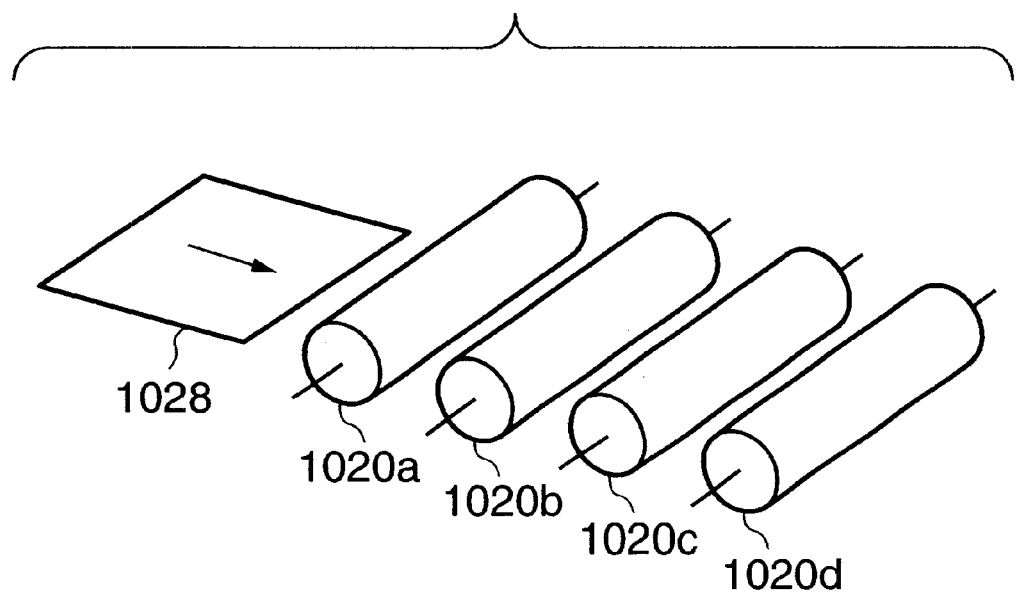
FIG. 12 is a view showing a construction of a color printer using four drums.
Figure 13:
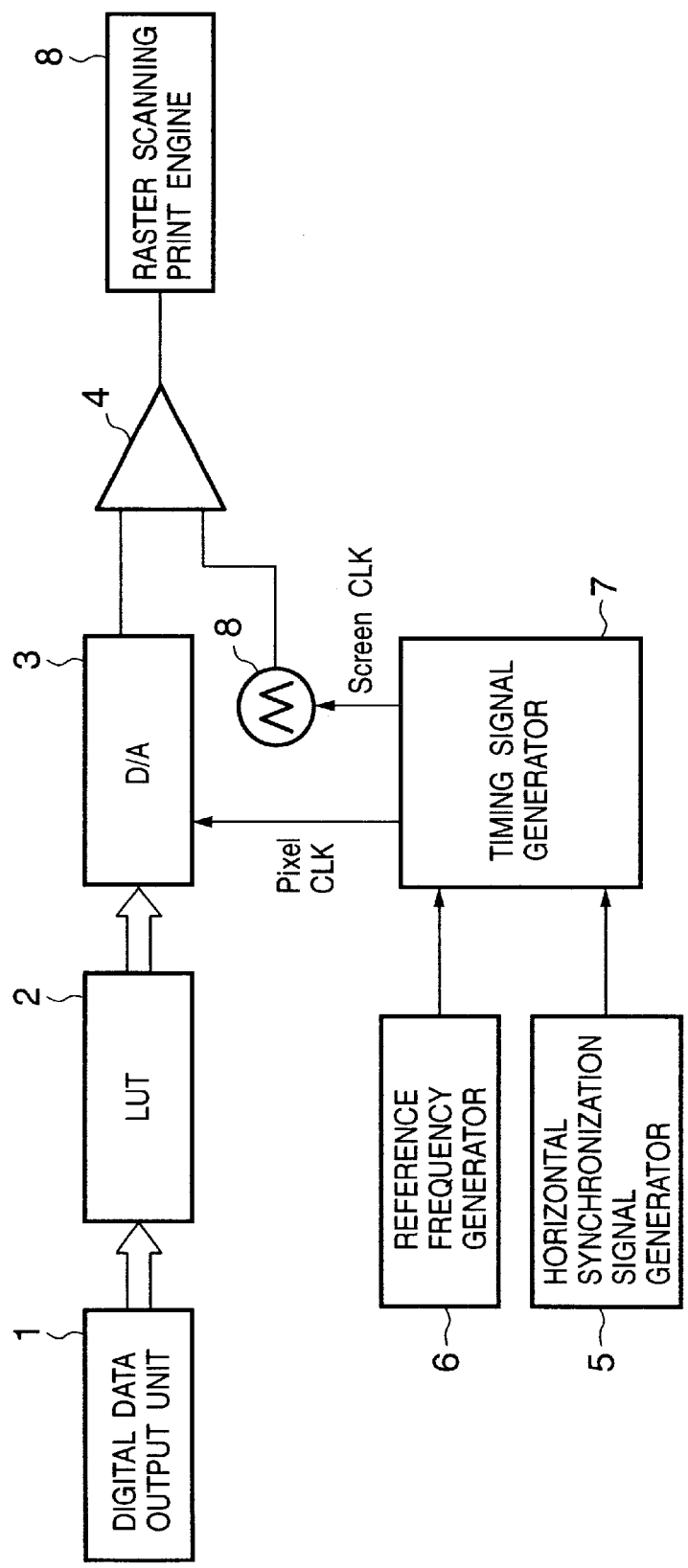
FIG. 13 is a block diagram showing a construction of an apparatus employing analog PWM.

For the components in FIG. 14 which are similar to those in FIG. 11, the same reference numerals are assigned to simplify the description.

A two-beam-type laser chip 23, having laser diodes a and b, comprises a photodiode c which receives backlight of each laser diode. The LD driver 24 supplies driving currents Id1 and Id2 for controlling emission of each laser diode. The monitor current Im, detecting the amount of light emitted from the photodiode, is inputted to the LD driver 24 to perform automatic power control (APC) of the amount of light emission of the laser diodes a and b. In the laser chip 23, two laser beams cannot be emitted at intervals of one pixel (about 42 μm for 600 dpi) because of the characteristic of the laser chip. For this reason, the laser chip is arranged at an angle so as to generate two beams in the positions apart from each other by, for instance, 16 pixels (printing pixel) in the laser scanning direction as shown in FIG. 14. A modulated laser beam generated by the laser chip 23 is polarized by the polygon mirror 18, which is fixed to a motor axle and rotated in the direction of the arrow shown in FIG. 14, and scanned on the photosensitive drum 20. The f-θ lens 19 is provided to condense the polarized modulated laser beam on the photosensitive drum 20 at a regular linear velocity. The photosensitive drum 20 and printing toner are electrostatically charged to predetermined levels in advance. Since the amount of toner attachment changes in accordance with the amount of light irradiated on the photosensitive drum 20, a halftone image can be printed. The BD mirror 21 is provided with a fixed mechanical position relation with the photosensitive drum 20. A laser beam reflected by the BD mirror 21 is inputted to the photoreceptive diode 22, and used to detect a data write starting position on the photosensitive drum 20. An output of the photoreceptive diode 22 is inputted to the horizontal synchronization signal generator 27 to generate a horizontal synchronization signal BD. The signal BD is inputted to the pixel modulator 25. The pixel modulator 25 generates a pixel clock synchronizing with the horizontal synchronization signal BD or a coefficient-fold clock of the signal BD. Based on the pixel clock, read clocks RK1 and RK2 for reading pixel data are inputted to the pixel data generator 26. The pixel data generator 26 outputs pixel data D1 and D2 and write clocks WK1 and WK2 to the pixel modulator 25. Based on the inputted pixel data, pixel modulation signals ON1 and ON2, which enable modulation of a desired amount of laser beam, are outputted to the LD driver 24.

To print a color image with the above construction, the two-beam structure is provided to each of the four drums for Y, M, C and K.

By employing the aforementioned construction of the above embodiment in the printer engine having foregoing construction, it is possible to realize position deviation correction in an image caused by a timing error of the signal BD in the image writing unit. This is electrically realized in a level of 1/32 pixel by controlling a phase (delay) of the pixel clock with absolute pixel position setting data RG in the pixel modulator 25.

Since the two-beam laser chip 23 is arranged at a gentle angle as mentioned above, an error or variation of the arrangement angle causes variations in the beam intervals, which then necessitate pixel position correction. However, the correction is also electrically possible in a level of 1/32 pixel by controlling a phase (delay) of the pixel clock with relative pixel position setting data RP in the pixel modulator 25.

Furthermore, it is necessary to correct an error of an image size, caused by unevenness in optical machine accuracy of the laser chip 23, polygon mirror 18, f-θ lens 19, and photosensitive drum 20. The correction is realized by incorporating a frequency synthesizer in the pixel modulator to change the pixel clock frequency, and then using pixel frequency setting data DF. Therefore, pixel position setting data DS for pixel positioning is inputted to the pixel modulator of the image writing unit in FIG. 14.

Although the above embodiment has described an example of a printer in which a laser beam scans the photosensitive drum, the present invention is not limited to this example. For instance, the present invention may be applied to an apparatus employing an array of LEDs, each of which is turned on/off for forming an electrostatic latent image on the photosensitive drum.

As has been described above, according to the present invention, in a case of performing pulsewidth modulation with the use of a digital data pattern, it is possible to perform appropriate pulsewidth modulation in accordance with variations of a device or a driving system.

As many apparently widely different embodiments of the present invention can be made without departing from the spirit and scope thereof, it is to be understood that the invention is not limited to the specific embodiments thereof except as defined in the claims.

What is claimed is:

1. A pulsewidth modulation apparatus for inputting multivalued pixel data expressed in a plurality of bits, generating a signal having a pulsewidth corresponding to a value of the multivalued pixel data, and outputting the generated signal to a predetermined print engine, comprising:

storage means arranged to store a digital pattern in an address position corresponding to the value of each multivalued pixel data in order to generate a binary-valued pattern corresponding to the value of the multivalued pixel data; and output means arranged to access said storage means by using inputted multivalued pixel data as an address to read a corresponding binary-valued pattern, and output a pulsewidth signal corresponding to a state of bits of the pattern, wherein the pattern stored in said storage means has a number of bits larger than a number that can be expressed by a number of bits of the inputted multivalued pixel data, and the pattern is rewritable.

2. The pulsewidth modulation apparatus according to claim 1, wherein the number of bits of each pattern stored in said storage means is twice as many as the number that can be expressed by a number of bits of the inputted multivalued pixel data.

3. The pulsewidth modulation apparatus according to claim 1, further comprising rewrite means arranged to rewrite the pattern stored in said storage means in accordance with a characteristic of the print engine.

4. The pulsewidth modulation apparatus according to claim 3, wherein the print engine includes laser driving means which performs emission/non emission of a laser beam in accordance with a pulsewidth signal, and light emission amount detection means which detects an average value of the emission amount of the laser beam, wherein upon sequentially outputting multivalued pixel test data, an average light emission amount is detected for each test data by said light emission amount detection means, a pattern to be written is determined based on the detected average light emission amount and a target light emission amount, and the determined pattern is stored in said storage means.

5. The pulsewidth modulation apparatus according to claim 1, further comprising addition means arranged to generate a pulsewidth signal, having a pulsewidth smaller than a pulsewidth reproduced by bits of the pattern, and add the generated pulsewidth signal to the pulsewidth signal outputted by said output means.

6. The pulsewidth modulation apparatus according to claim 5, wherein said addition means adds a pulsewidth which achieves a lowest density that can be reproduced by the print engine.

7. The pulsewidth modulation apparatus according to claim 1, wherein the print engine is a laser beam printer engine.

8. The pulsewidth modulation apparatus according to claim 7, comprising means for scanning two laser beams on one photosensitive drum of the laser beam printer engine, wherein each of said scanning means includes said storage means and said output means.

9. An image printing apparatus for printing an image on a printing medium by inputting multivalued pixel data expressed in a plurality of bits, generating a pulsewidth modulation signal having a pulsewidth corresponding to a value of the multivalued pixel data, and outputting the pulsewidth modulation signal to a print engine, comprising:

storage means arranged to store a digital pattern in an address position corresponding to the value of each multivalued pixel data in order to generate a binary-valued pattern corresponding to the value of the multivalued pixel data; and output means arranged to access said storage means by using inputted multivalued pixel data as an address to read a corresponding binary-valued pattern, and output a pulsewidth signal corresponding to a state of bits of the pattern, wherein the pattern stored in said storage means has a number of bits larger than a number that can be expressed by a number of bits of the inputted multivalued pixel data, and the pattern is rewritable.

10. A control method of an image printing apparatus for printing an image on a printing medium by outputting a pulsewidth modulation signal to a print engine, said image printing apparatus including: input means which inputs multivalued pixel data expressed in a plurality of bits; storage means which stores for a value of each multivalued pixel data a binary-valued pattern constructed with a number of bits larger than a maximum value that can be expressed by inputted multivalued pixel data; and output means which accesses the storage means by using the inputted multivalued pixel data as an address to read a corresponding binary-valued pattern and outputs a pulsewidth signal corresponding to a state of bits of the pattern, said control method comprising the steps of:
    detecting a state of the print engine for each test data by sequentially outputting multivalued pixel test data;
    determining a pattern to be written based on the state detected in said detecting step and a target state; and
    storing the determined pattern in the storage means.

11. The control method of an image printing apparatus according to claim 10, said print engine including laser driving means which performs emission/non emission of a laser beam in accordance with a pulsewidth signal, and light emission amount detection means which detects an average value of the emission amount of the laser beam, wherein in said detecting step, multivalued pixel test data is sequentially outputted, and an average light emission amount is detected for each test data by the light emission amount detection means.

12. The control method of an image printing apparatus according to claim 11, said image printing apparatus including addition means which generates a pulsewidth signal having a pulsewidth smaller than a pulsewidth reproduced by bits of the pattern, and adds the generated pulsewidth signal to the pulsewidth signal outputted by the output means, said control method further comprising the step of setting the addition means to add a pulsewidth which achieves a lowest density that can be reproduced by the print engine.

* * * * *